US012229079B2

(12) United States Patent
Piednoel

(10) Patent No.: US 12,229,079 B2
(45) Date of Patent: Feb. 18, 2025

(54) MULTIPLE SYSTEM-ON-CHIP ARRANGEMENT FOR VEHICLE COMPUTING SYSTEMS

(71) Applicant: Mercedes-Benz Group AG, Stuttgart (DE)

(72) Inventor: Francois Piednoel, Sunnyvale, CA (US)

(73) Assignee: Mercedes-Benz Group AG, Stuttgart (DE)

( * ) Notice: Subject to any disclaimer, the term of this patent is extended or adjusted under 35 U.S.C. 154(b) by 0 days.

(21) Appl. No.: 18/195,776

(22) Filed: May 10, 2023

(65) Prior Publication Data

US 2024/0378172 A1    Nov. 14, 2024

(51) Int. Cl.
*G06F 15/78* (2006.01)
*G06F 1/30* (2006.01)

(52) U.S. Cl.
CPC ............ *G06F 15/7814* (2013.01); *G06F 1/30* (2013.01); *G06F 15/7807* (2013.01); *G06F 15/781* (2013.01); *G06F 15/7825* (2013.01)

(58) Field of Classification Search
CPC ............. G06F 15/7807; G06F 15/7814; G06F 15/7825; G06F 1/30
See application file for complete search history.

(56) References Cited

U.S. PATENT DOCUMENTS

| | | | |
|---|---|---|---|
| 10,992,257 B2 | 4/2021 | Narla | |
| 11,388,054 B2 | 7/2022 | Bernat | |
| 11,410,266 B2 | 8/2022 | Matam | |
| 11,507,527 B2 | 11/2022 | Saleh | |
| 11,565,606 B2 | 1/2023 | Kazuno | |
| 11,573,856 B1 | 2/2023 | Ditty | |
| 2011/0119453 A1* | 5/2011 | Xu | G06F 11/2028 711/E12.066 |

(Continued)

FOREIGN PATENT DOCUMENTS

| | | |
|---|---|---|
| CN | 207133812 U | 3/2018 |
| CN | 110879546 A | 3/2020 |

(Continued)

OTHER PUBLICATIONS

International Search Report with Written Opinion of the International Searching Authority for the Application No. PCT/EP2024/057310 mailed Jun. 24, 2024.

*Primary Examiner* — Jacob Petranek
(74) *Attorney, Agent, or Firm* — Mahamedi IP Law LLP

(57) ABSTRACT

A computing system can include a first system on chip (SoC) and a second SoC. Each SoC can comprise a memory in which the SoC publishes state information. For the first SoC, the state information can correspond to a set of tasks being performed by the first SoC, where the first SoC utilizes a plurality of computational components to perform the set of tasks. The first SoC can directly access the memory of the first SoC to dynamically read the state information published by the first SoC. In a backup role, the second SoC maintains a subset of its computational components in a low power state. When the second SoC detects a trigger while reading the state information published in the first memory of the first SoC, the second SoC powers the subset of computational components to take over the set of tasks.

18 Claims, 6 Drawing Sheets

(56) References Cited

U.S. PATENT DOCUMENTS

| | | | |
|---|---|---|---|
| 2018/0370540 A1* | 12/2018 | Yousuf | B60W 10/04 |
| 2019/0250611 A1* | 8/2019 | Costin | H04N 7/181 |
| 2019/0391855 A1 | 9/2019 | Bernat | |
| 2020/0012576 A1 | 1/2020 | Cormack et al. | |
| 2020/0017114 A1 | 1/2020 | Santoni et al. | |
| 2021/0133057 A1 | 5/2021 | Hayes et al. | |
| 2022/0019396 A1* | 1/2022 | Choi | G06F 3/1438 |
| 2022/0114028 A1 | 4/2022 | Peng et al. | |
| 2022/0185115 A1 | 6/2022 | Divekar et al. | |
| 2022/0283971 A1 | 9/2022 | Lee | |
| 2023/0032305 A1 | 2/2023 | Krishnani | |
| 2023/0035610 A1 | 2/2023 | Lee | |
| 2023/0036117 A1 | 2/2023 | Krishnani | |
| 2023/0055136 A1 | 2/2023 | Mysore Shantamurthy et al. | |
| 2023/0063601 A1 | 3/2023 | Upadhyay | |
| 2023/0342503 A1 | 10/2023 | Zhao et al. | |
| 2024/0012673 A1* | 1/2024 | Garbett | G06F 11/0721 |
| 2024/0089181 A1* | 3/2024 | Binet | G06F 11/165 |

FOREIGN PATENT DOCUMENTS

| | | |
|---|---|---|
| CN | 112149369 A | 12/2020 |
| CN | 114780227 A | 7/2022 |
| CN | 115688093 A | 2/2023 |
| EP | 4 261 727 A1 | 10/2023 |
| KR | 20210015472 A | 2/2021 |
| WO | 2022/141128 A1 | 7/2022 |

* cited by examiner

MULTIPLE SYSTEM-ON-CHIP ARRANGEMENT FOR VEHICLE COMPUTING SYSTEMS

BACKGROUND

Universal Chiplet Interconnect Express (UCIe) provides an open specification for an interconnect and serial bus between chiplets, which enables the production of large system-on-chip (SoC) packages with intermixed components from different silicon manufacturers. Autonomous vehicle computing systems may operate using chiplet arrangements that follow the UCIe specification. One goal of creating such computing systems is to achieve the robust safety integrity levels of other important electrical and electronic (E/E) automotive components of the vehicle.

SUMMARY

An on-board, vehicle computing system is described herein that implements multiple system-on-chip (MSoC) architecture to provide redundancy, increase wear life of hardware components, and increase the safety integrity rating of the computing system. The system can include a first SoC comprising a first memory in which the first SoC publishes state information corresponding to a set of tasks being performed by the first SoC. The first SoC further includes a plurality of computational components, which can comprise various chiplets implementing the set of tasks. The computing system can further include a second SoC comprising a second memory and a second plurality of computational components. The second SoC can have direct memory access to the first memory of the first SoC to dynamically read the state information published by the first SoC. In various examples, the second SoC maintains a subset of the second plurality of computational components in a low power state. When the second SoC detects a trigger while reading the state information published in the first memory of the first SoC, the second SoC powers the subset of computational components to take over the set of tasks.

In various implementations, the set of tasks can comprise autonomous driving tasks, which can include sensor data processing, inference, scene understanding, object detection and classification, motion prediction of dynamic external agents, and/or motion planning and execution to operate an autonomous vehicle along a travel route. The state information published by the first SoC into its memory can generally include all information necessary for the second SoC to take over the set of autonomous driving tasks. For example, the state information can comprise statistical information corresponding to a surrounding environment of the vehicle in which the computing system resides. It is contemplated that multiple SoC pairs may be implemented, with each pair performing a subset of the autonomous driving tasks. For example, one SoC pair may be configured to perform object detection tasks, a second SoC pair may be configured to perform object classification tasks, a third SoC pair may be configured to perform motion prediction tasks, etc. Accordingly, the set tasks for a SoC pair may comprise a subset of the overall set of tasks required to autonomously operate the vehicle. It is further contemplated that the implementation of SoC pairs may be used for semi-autonomous driving purposes, such as for use with an advanced driver assistance system (ADAS) that can perform various automated functions. These functions can include collision warning, emergency braking, lane following, lane centering, emergency maneuvering, automated parking, and the like.

In various examples, the trigger for taking over the set of tasks by the second SoC can correspond to the first SoC experiencing a fault or failure. As provided herein, the fault or the failure experienced by the first SoC can correspond to overheating, power surges, and/or errors in the first SoC. Such errors can correspond to hardware errors (e.g., transistor failures) that may affect the first SoC's performance in completing the set of tasks. In certain examples, when the second SoC powers up its subset of computational components from a sleep state or low powered state and takes over the set of tasks from the first SoC, the first SoC may automatically reset or reboot its computational components to attempt to resolve the fault(s) and/or failure(s). Upon resetting or rebooting, the first SoC can assume the previous backup tasks of the second SoC. That is, the first SoC can directly access the memory of the second SoC to continuously read state information corresponding to the second SoC performing the set of autonomous driving tasks. Meanwhile, the second SoC performs the set of autonomous driving tasks and publishes state information corresponding to the set of autonomous driving tasks in its memory.

In certain implementations, the first SoC can be powered by a first power source of the vehicle, and the second SoC can powered by a second power source of the vehicle that is largely isolated from the first power source. For example, an electric vehicle can include a battery pack that provides power to electric motors to propel the vehicle, and an auxiliary battery (e.g., a standard 12-volt battery) that powers the auxiliary components of the vehicle, such as the electronic control unit (ECU), dash features, power windows, lights, etc. For such a vehicle, the first SoC may be powered by the battery pack and the second SoC may be powered by the auxiliary battery. In further examples, the first SoC and the second SoC can be electrically coupled to each other via an interconnect having at least one electrical safety switch (e.g., one or more eFuses) to protect the computing system from power surges from either the first SoC or the second SoC. As such, the first SoC and the second SoC can be electrically insolated from each other (i.e., isolated in terms of power source, and insulated in terms of power surge corruption).

As provided herein, each time the computing system is rebooted, the first SoC and the second SoC can switch between primary and backup roles. Accordingly, in normal operation when neither experiences a fault or failure, if the first SoC performs the set of tasks during a first computing session (e.g., the vehicle taking a trip), the second SoC will perform the set of tasks during a second computing session (e.g., the vehicle returning from the trip). Whichever "primary" SoC performs the set of tasks during a particular computing session, the "backup" SoC will continuously read the memory of the primary SoC, with its subset of computational components in a low power state, but warmed up and ready to take over the set of tasks from the primary SoC.

In further implementations, the primary SoC can continuously read the memory of the backup SoC to verify that the backup SoC is ready to take over the set of tasks of the primary SoC. In a scenario in which the primary SoC detects that the backup SoC is not ready (e.g., is experiencing a fault or failure), the primary SoC can cause the backup SoC to perform a reset and/or reboot of its computational components to attempt to resolve the fault or failure.

It is contemplated that the arrangement of the SoC pairs in which a backup SoC dynamically reads state information and takes over the set of tasks provides redundancy to facilitate an automotive safety integrity level (ASIL) rating for the computing system. As described herein, the computational components of each SoC can comprise chiplets, such as one or more computer processing unit (CPU) chiplets, one or more autonomous drive chiplets, one or more machine learning (ML) accelerator chiplets, one or more sensor input chiplets, and/or one or more high bandwidth memory (HBM) chiplets. As further described herein, the computational components of each SoC can include a functional safety (FuSa) CPU that publishes state information of the SoC to a FuSa component of the SoC's memory. This FuSa memory component, comprising the state information, can be directly read by each SoC. Thus, while the other computational components of the SoC can be implemented in a low power state, the FuSa component (e.g., a dedicated FuSa CPU) can remain powered up and operational regardless of whether the SoC is in the primary or backup role.

BRIEF DESCRIPTION OF THE DRAWINGS

The disclosure herein is illustrated by way of example, and not by way of limitation, in the figures of the accompanying drawings in which like reference numerals refer to similar elements, and in which.

DETAILED DESCRIPTION

Figure 1:
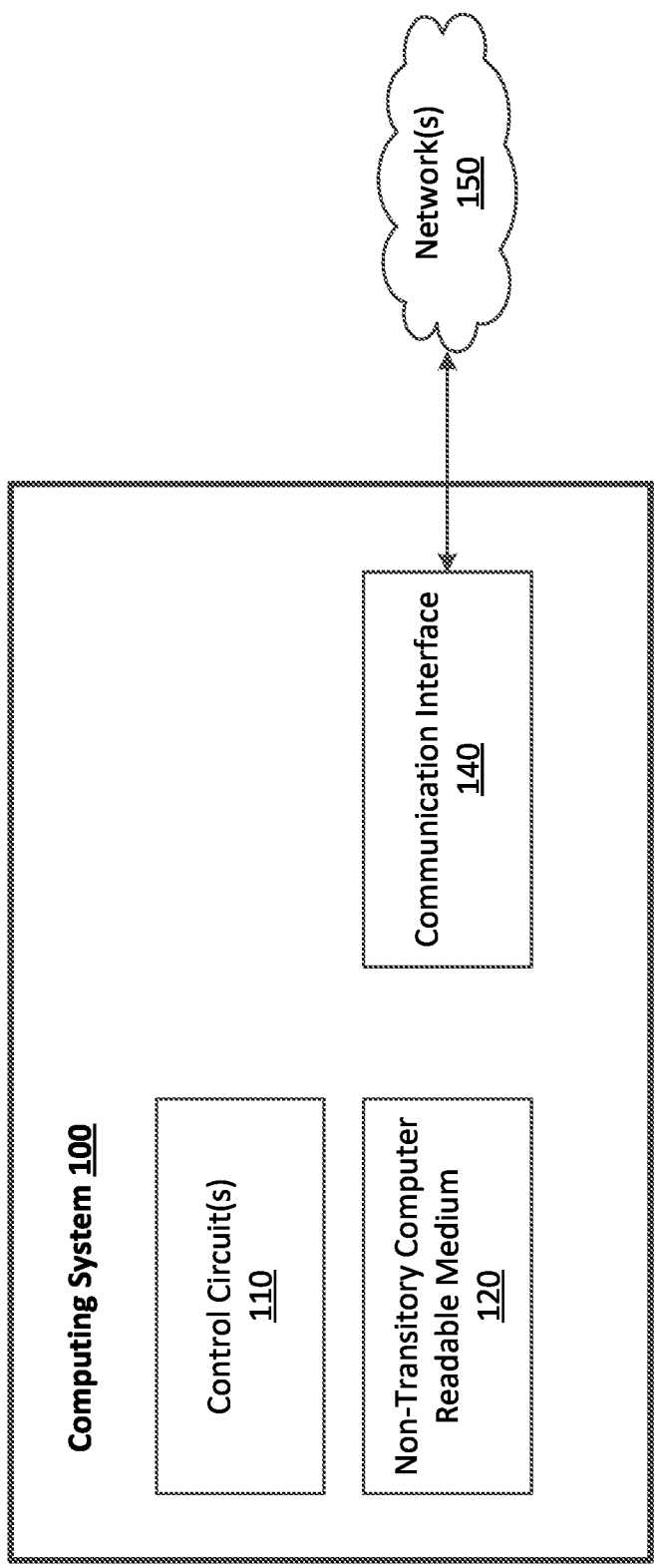
FIG. 1 is a block diagram depicting an example computing system in which embodiments described herein may be implemented, in accordance with examples described herein.

In experimentation and controlled testing environments, system redundancies and automotive safety integrity level (ASIL) ratings for autonomy systems are not typically a priority consideration. As autonomous driving features continue to advance (e.g., beyond Level 3 autonomy), and autonomous vehicles begin operating more commonly on public road networks, the qualification and certification of E/E components related to autonomous operation of the vehicle will be advantageous to ensure operational safety of these vehicles. Furthermore, novel methods for qualifying and certifying hardware, software, and/or hardware/software combinations will also be advantageous in increasing public confidence and assurance that autonomous driving systems are safe beyond current standards. For example, certain safety standards for autonomous driving systems include safety thresholds that correspond to average human abilities and care. Yet, these statistics include vehicle incidences involving impaired or distracted drivers and do not factor in specified time windows in which vehicle operations are inherently riskier (e.g., inclement weather conditions, late night driving, winding mountain roads, etc.).

Automotive safety integrity level (ASIL) is a risk classification scheme defined by ISO 26262 (the functional safety for road vehicles standard), and is typically established for the E/E components of the vehicle by performing a risk analysis of potential hazards, which involves determining respective levels of severity (i.e., the severity of injuries the hazard can be expected to cause; classified between S0 (no injuries) and S3 (life-threatening injuries)), exposure (i.e., the relative expected frequency of the operational conditions in which the injury can occur; classified between E0 (incredibly unlikely) and E4 (high probability of injury under most operating conditions)), and controllability (i.e., the relative likelihood that the driver can act to prevent the injury; classified between C0 (controllable in general) and C3 difficult to control or uncontrollable)) of the vehicle operating scenario. As such, the safety goal(s) for any potential hazard event includes a set of ASIL requirements.

Hazards that are identified as quality management (QM) do not dictate any safety requirements. As an illustration, these QM hazards may be any combination of low probability of exposure to the hazard, low level of severity of potential injuries resulting from the hazard, and a high level of controllability by the driver in avoiding the hazard and/or preventing injuries. Other hazard events are classified as ASIL-A, ASIL-B, ASIL-C, or ASIL-D depending on the various levels of severity, exposure, and controllability corresponding to the potential hazard. ASIL-D events correspond to the highest integrity requirements (ASIL requirements) on the safety system or E/E components of the safety system, and ASIL-A comprises the lowest integrity requirements. As an example, the airbags, anti-lock brakes, and power steering system of a vehicle will typically have an ASIL-D grade, where the risks associated with the failure of these components (e.g., the probable severity of injury and lack of vehicle controllability to prevent those injuries) are relatively high.

As provided herein, the ASIL may refer to both risk and risk-dependent requirements, where the various combinations of severity, exposure, and controllability are quantified to form an expression of risk (e.g., an airbag system of a vehicle may have a relatively low exposure classification, but high values for severity and controllability). As provided above, the quantities for severity, exposure, and controllability for a given hazard are traditionally determined using values for severity (e.g., S0 through S3), exposure (e.g., E0 through E4), and controllability (e.g., C0 through C3) in the ISO 26262 series, where these values are then utilized to classify the ASIL requirements for the components of a particular safety system. As provided herein, certain safety systems can perform variable mitigation measures, which can range from alerts (e.g., visual, auditory, or haptic alerts), minor interventions (e.g., brake assist or steer assist), major interventions and/or avoidance maneuvering (e.g., taking over control of one or more control mechanisms, such as the steering, acceleration, or braking systems), and full autonomous control of the vehicle.

Current fully autonomous driving systems can comprise non-deterministic inference models, in which the system executes one or more perception, object detection, object classification, motion prediction, motion planning, and vehicle control techniques based on, for example, two-dimensional image data, to perform all autonomous driving tasks. It is contemplated that such implementations may be difficult or impossible to certify and provide an ASIL rating for the overall autonomous driving system. To address these shortcomings in current implementations, an autonomous driving system is provided herein that may perform deterministic, reflexive inference operations on specified hardware arrangements that allow for the certification and ASIL grading of various components, software aspects of the system, and/or the entire autonomous driving system itself.

In accordance with examples described herein, the use of a dual SoC arrangement in which each SoC in the pair alternates between primary and backup responsibilities can facilitate in the overall certification and ASIL grade of the autonomous driving system of the vehicle. In this arrangement, the first SoC and second SoC utilize isolated power sources and can be electrically coupled to each other by way of eFuses (e.g., active circuit protection devices with integrated field-effect transistors (FETs) used to limit currents and voltages to safe levels during fault conditions), which can further bolster the ASIL grade of the arrangement. The SoCs may have direct memory access to each other (e.g., via a functional safety component of each SoC), which can facilitate dynamic health monitoring, error checks, and seamless transitions between primary and backup status.

In certain implementations, the computing system can perform one or more functions described herein using a learning-based approach, such as by executing an artificial neural network (e.g., a recurrent neural network, convolutional neural network, etc.) or one or more machine-learning models. Such learning-based approaches can further correspond to the computing system storing or including one or more machine-learned models. In an embodiment, the machine-learned models may include an unsupervised learning model. In an embodiment, the machine-learned models may include neural networks (e.g., deep neural networks) or other types of machine-learned models, including non-linear models and/or linear models. Neural networks may include feed-forward neural networks, recurrent neural networks (e.g., long short-term memory recurrent neural networks), convolutional neural networks or other forms of neural networks. Some example machine-learned models may leverage an attention mechanism such as self-attention. For example, some example machine-learned models may include multi-headed self-attention models (e.g., transformer models).

As provided herein, a "network" or "one or more networks" can comprise any type of network or combination of networks that allows for communication between devices. In an embodiment, the network may include one or more of a local area network, wide area network, the Internet, secure network, cellular network, mesh network, peer-to-peer communication link or some combination thereof and may include any number of wired or wireless links. Communication over the network(s) may be accomplished, for instance, via a network interface using any type of protocol, protection scheme, encoding, format, packaging, etc.

As further provided herein, an "autonomy map" or "autonomous driving map" comprises a ground truth map recorded by a mapping vehicle using various sensors (e.g., LIDAR sensors and/or a suite of cameras or other imaging devices) and labeled to indicate traffic and/or right-of-way rules at any given location. For example, a given autonomy map can be human labeled based on observed traffic signage, traffic signals, and lane markings in the ground truth map. In further examples, reference points or other points of interest may be further labeled on the autonomy map for additional assistance to the autonomous vehicle. Autonomous vehicles or self-driving vehicles may then utilize the labeled autonomy maps to perform localization, pose, change detection, and various other operations required for autonomous driving on public roads. For example, an autonomous vehicle can reference an autonomy map for determining the traffic rules (e.g., speed limit) at the vehicle's current location, and can dynamically compare live sensor data from an on-board sensor suite with a corresponding autonomy map to safely navigate along a current route.

Among other benefits, the examples described herein achieve a technical effect of providing redundancy and functional safety monitoring for MSoCs to, for example, increase the safety integrity level of an autonomous vehicle computing system.

One or more examples described herein provide that methods, techniques, and actions performed by a computing device are performed programmatically, or as a computer implemented method. Programmatically, as used herein, means through the use of code or computer-executable instructions. These instructions can be stored in one or more memory resources of the computing device. A programmatically performed step may or may not be automatic.

One or more examples described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

Some examples described herein can generally require the use of computing devices, including processing and memory resources. For example, one or more examples described herein may be implemented, in whole or in part, on computing devices such as servers and/or personal computers using network equipment (e.g., routers). Memory, processing, and network resources may all be used in connection with the establishment, use, or performance of any example described herein (including with the performance of any method or with the implementation of any system).

Furthermore, one or more examples described herein may be implemented through the use of instructions that are executable by one or more processors. These instructions may be carried on a non-transitory computer-readable medium. Machines shown or described with figures below provide examples of processing resources and computer-readable mediums on which instructions for implementing examples disclosed herein can be carried and/or executed. In particular, the numerous machines shown with examples of the invention include processors and various forms of memory for holding data and instructions. Examples of non-transitory computer-readable mediums include permanent memory storage devices, such as hard drives on personal computers or servers. Other examples of computer storage mediums include portable storage units, such as flash memory or magnetic memory. Computers, terminals, network-enabled devices are all examples of machines and devices that utilize processors, memory, and instructions stored on computer-readable mediums. Additionally, examples may be implemented in the form of computer programs, or a computer usable carrier medium capable of carrying such a program.

Example Computing System

FIG. 1 is a block diagram depicting an example computing system 100 in which embodiments described herein may be implemented, in accordance with examples described herein. In an embodiment, the computing system 100 can include one or more control circuits 110 that may include one or more processors (e.g., microprocessors), one or more processing cores, a programmable logic circuit (PLC) or a programmable logic/gate array (PLA/PGA), a field programmable gate array (FPGA), an application specific integrated circuit (ASIC), systems on chip (SoCs), or any other control circuit. In some implementations, the control circuit(s) 110 and/or computing system 100 may be part of, or may form, a vehicle control unit (also referred to as a vehicle controller) that is embedded or otherwise disposed in a vehicle (e.g., a Mercedes-Benz® car, truck, or van). For example, the vehicle controller may be or may include an infotainment system controller (e.g., an infotainment head-unit), a telematics control unit (TCU), an electronic control unit (ECU), a central powertrain controller (CPC), a central exterior & interior controller (CEIC), a zone controller, an autonomous vehicle control system, or any other controller (the term "or" is used herein interchangeably with "and/or").

In an embodiment, the control circuit(s) 110 may be programmed by one or more computer-readable or computer-executable instructions stored on the non-transitory computer-readable medium 120. The non-transitory computer-readable medium 120 may be a memory device, also referred to as a data storage device, which may include an electronic storage device, a magnetic storage device, an optical storage device, an electromagnetic storage device, a semiconductor storage device, or any suitable combination thereof. The non-transitory computer-readable medium 120 may form, for example, a computer diskette, a hard disk drive (HDD), a solid state drive (SDD) or solid state integrated memory, a random access memory (RAM), a read-only memory (ROM), an erasable programmable read-only memory (EPROM or Flash memory), a static random access memory (SRAM), dynamic random access memory (DRAM), a portable compact disc read-only memory (CD-ROM), a digital versatile disk (DVD), and/or a memory stick. In some cases, the non-transitory computer-readable medium 120 may store computer-executable instructions or computer-readable instructions, such as instructions to perform the below methods described in connection with FIGS. 5 and 6.

In various embodiments, the terms "computer-readable instructions" and "computer-executable instructions" are used to describe software instructions or computer code configured to carry out various tasks and operations. In various embodiments, if the computer-readable or computer-executable instructions form modules, the term "module" refers broadly to a collection of software instructions or code configured to cause the control circuit 110 to perform one or more functional tasks. The modules and computer-readable/executable instructions may be described as performing various operations or tasks when the control circuit(s) 110 or other hardware components execute the modules or computer-readable instructions.

In further embodiments, the computing system 100 can include a communication interface 140 that enables communications over one or more networks 150 to transmit and receive data. In various examples, the computing system 100 can communicate, over the one or more networks 150, with fleet vehicles using the communication interface 140 to receive sensor data and implement the intersection classification methods described throughout the present disclosure. In certain embodiments, the communication interface 140 may be used to communicate with one or more other systems. The communication interface 140 may include any circuits, components, software, etc. for communicating via one or more networks 150 (e.g., a local area network, wide area network, the Internet, secure network, cellular network, mesh network, and/or peer-to-peer communication link). In some implementations, the communication interface 140 may include for example, one or more of a communications controller, receiver, transceiver, transmitter, port, conductors, software and/or hardware for communicating data/information.

As an example embodiment, the control circuit(s) 110 of the computing system 100 can include a dual SoC arrangement that facilitates the various methods and techniques described throughout the present disclosure. In various examples, the SoCs can perform a set of tasks in a primary SoC and backup SoC arrangement, where the primary SoC performs the set of tasks, and the backup SoC maintains a standby state and monitors the status and/or state of the primary SoC. In various implementations, the set of tasks can comprise a set of autonomous driving tasks, such as perception, object detection and classification, grid occupancy determination, sensor data fusion and processing, motion prediction (e.g., of dynamic external entities), motion planning, and vehicle control tasks for autonomously operating a vehicle along a travel route. As described herein, multiple dual SoC arrangements may be implemented for performing these tasks, with each SoC pair being configured in the manner described in detail below.

System Description

Figure 2:
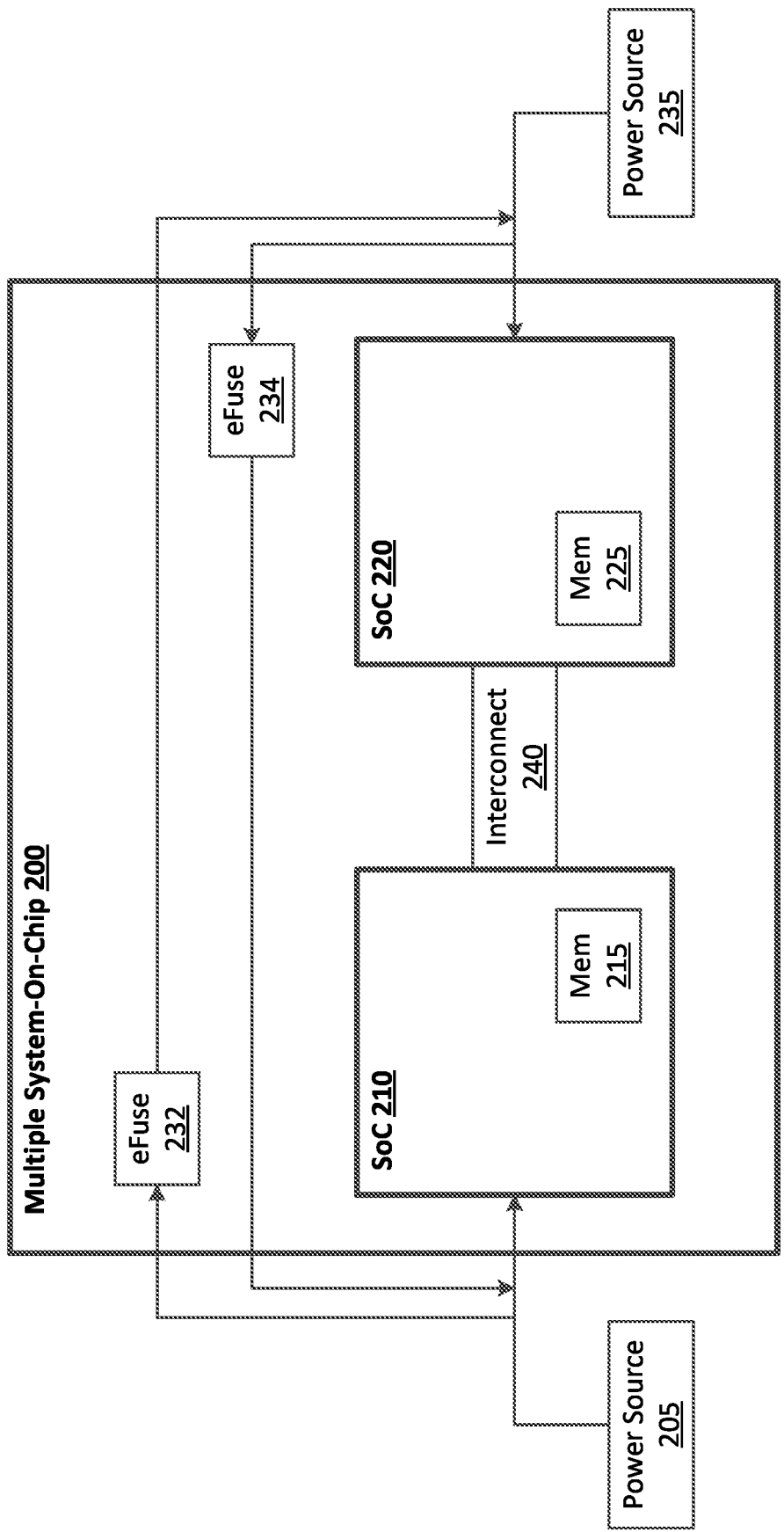
FIG. 2 is a block diagram depicting an example multiple system-on-chip (MSoC), in accordance with examples described herein.

FIG. 2 is a block diagram depicting an example computing system 200 implementing a multiple system-on-chip (MSoC), in accordance with examples described herein. In various examples, the computing system 200 can include a first SoC 210 having a first memory 215 and a second SoC 220 having a second memory 225 coupled by an interconnect 240 (e.g., an ASIL-D rated interconnect) that enables each of the first SoC 210 and second SoC 220 to read each other's memories 215, 225. During any given session, the first SoC 210 and the second SoC 220 may alternate roles, between a primary SoC and a backup SoC. As provided herein, the primary SoC can perform various autonomous driving tasks, such as perception, object detection and classification, grid occupancy determination, sensor data fusion and processing, motion prediction (e.g., of dynamic external entities), motion planning, and vehicle control tasks. The backup SoC can maintain a set of computational components (e.g., CPUs, ML accelerators, and/or memory chiplets) in a low power state, and continuously or periodically read the memory of the primary SoC.

For example, if the first SoC 210 is the primary SoC and the second SoC 220 is the backup SoC, then the first SoC 210 performs a set of autonomous driving tasks and publishes state information corresponding to these tasks in the first memory 215. The second SoC 220 reads the published state information in the first memory 215 to continuously check that the first SoC 210 is operating within nominal thresholds (e.g., temperature thresholds, bandwidth and/or memory thresholds, etc.), and that the first SoC 210 is performing the set of autonomous driving tasks properly. As such, the second SoC 220 performs health monitoring and error management tasks for the first SoC 210, and takes over control of the set of autonomous driving tasks when a triggering condition is met. As provided herein, the triggering condition can correspond to a fault, failure, or other error experienced by the first SoC 210 that may affect the performance of the set of tasks by the first SoC 210.

In various implementations, the second SoC 220 can publish state information corresponding to its computational components being maintained in a standby state (e.g., a low power state in which the second SoC 220 maintains readiness to take over the set of tasks from the first SoC 210). In such examples, the first SoC 210 can monitor the state information of the second SoC 220 by continuously or periodically reading the memory 225 of the second SoC 220 to also perform health check monitoring and error management on the second SoC 220. For example, if the first SoC 210 detects a fault, failure, or other error in the second SoC 220, the first SoC 210 can trigger the second SoC 220 to perform a system reset or reboot.

In certain examples, the first SoC 210 and the second SoC 220 can each include a functional safety (FuSa) component that performs the health monitoring and error management tasks. The FuSa component can be maintained in a powered state for each SoC, whether the SoC operates in a primary or backup manner. As such, the backup SoC may maintain its other components in a low powered state, with its FuSa component being powered up and performing the heath monitoring and error management tasks described herein.

In various aspects, when the first SoC 210 operates as the primary SoC, the state information published in the first memory 215 can correspond to the set of tasks being performed by the first SoC 210. For example, the first SoC 210 can publish any information corresponding to the surrounding environment of the vehicle (e.g., any external entities identified by the first SoC 210, their locations, and predicted trajectories, detected objects, such as traffic signals, signage, lane markings, and crosswalk, and the like). The state information can further include the operating temperatures of the computational components of the first SoC 210, bandwidth usage and available memory of the chiplets of the first SoC 210, and/or any faults or errors, or information indicating faults or errors in these components.

In further aspects, when the second SoC 220 operates as the backup SoC, the state information published in the second memory 225 can correspond to the state of each computational component of the second SoC 220. In particular, these components may operate in a low power state in which the components are ready to take over the set of tasks being performed by the first SoC 210. The state information can include whether the components are operating within nominal temperatures and other nominal ranges (e.g., available bandwidth, power, memory, etc.).

As described throughout the present disclosure, the first SoC 210 and the second SoC 220 can switch between operating as the primary SoC and the backup SoC (e.g., each time the system 200 is rebooted). For example, in a computing session subsequent to a session in which the first SoC 210 operated as the primary SoC and the second SoC 220 operated as the backup SoC, the second SoC 220 can assume the role of the primary SoC and the first SoC 210 can assume the role of the backup SoC. It is contemplated that this process of switching roles between the two SoCs can provide substantially even wear of the hardware components of each SoC, which can prolong the lifespan of the computing system 200 as a whole.

According to embodiments, the first SoC 210 can be powered by a first power source 205 and the second SoC 220 can be powered by a second power source 235 that is independent or isolated from the first power source 205. For example, in an electric vehicle, the first power source 205 can comprise the battery pack used for propelling the electric motors of the vehicle, and the second power source 235 can comprise the auxiliary power source of the vehicle (e.g., a 12-volt battery). In other implementations, the first and second power sources 205, 235 can comprise other types of power sources, such as dedicated batteries for each SoC 210, 220 or other power sources that are electrically isolated or otherwise not dependent from each other.

In various implementations, the first SoC 210 and the second SoC 220 may be electrically "insolated" from each other via a set of one or more eFuses 232, 234, which can be triggered if, for example, a power surge occurs in the system 200. The eFuse 232 and eFuse 234 can comprise a physical fuse (e.g., a microscopic fuse place in the computer chip), a logical fuse consisting of a computer program that trips when current and/or voltage exceeds a specified threshold, or a combination of a physical and logical fuse. In an example scenario, if SoC 220 experiences a power surge, eFuse 234 will trip and prevent the same power surge from affecting SoC 210. Conversely, if SoC 210 experiences a power surge, eFuse 232 will trip and prevent the same power surge from affecting SoC 220. Thus, if a power surge occurs, at least one of the SoCs will remain operational (e.g., and operate as the primary SoC), while the SoC that has experienced the power surge can reboot or reset and/or operate as the backup SoC.

It is contemplated that the MSoC arrangement of the computing system 200 can be provided to increase the safety integrity level (e.g., ASIL rating) of the computing system 200 and the overall autonomous driving system of the vehicle. As described herein, the autonomous driving system can include any number of dual SoC arrangements, each of which can perform a set of autonomous driving tasks. In doing so, the backup SoC dynamically monitors the health of the primary SoC in accordance with a set of functional safety operations, such that when a fault, failure, or other error is detected, the backup SoC can readily power up its components and take over the set of tasks from the primary SoC. A further description of the SoCs and their computational components is provided below with respect to FIG. 3.

Example System-on-Chip

Figure 3:
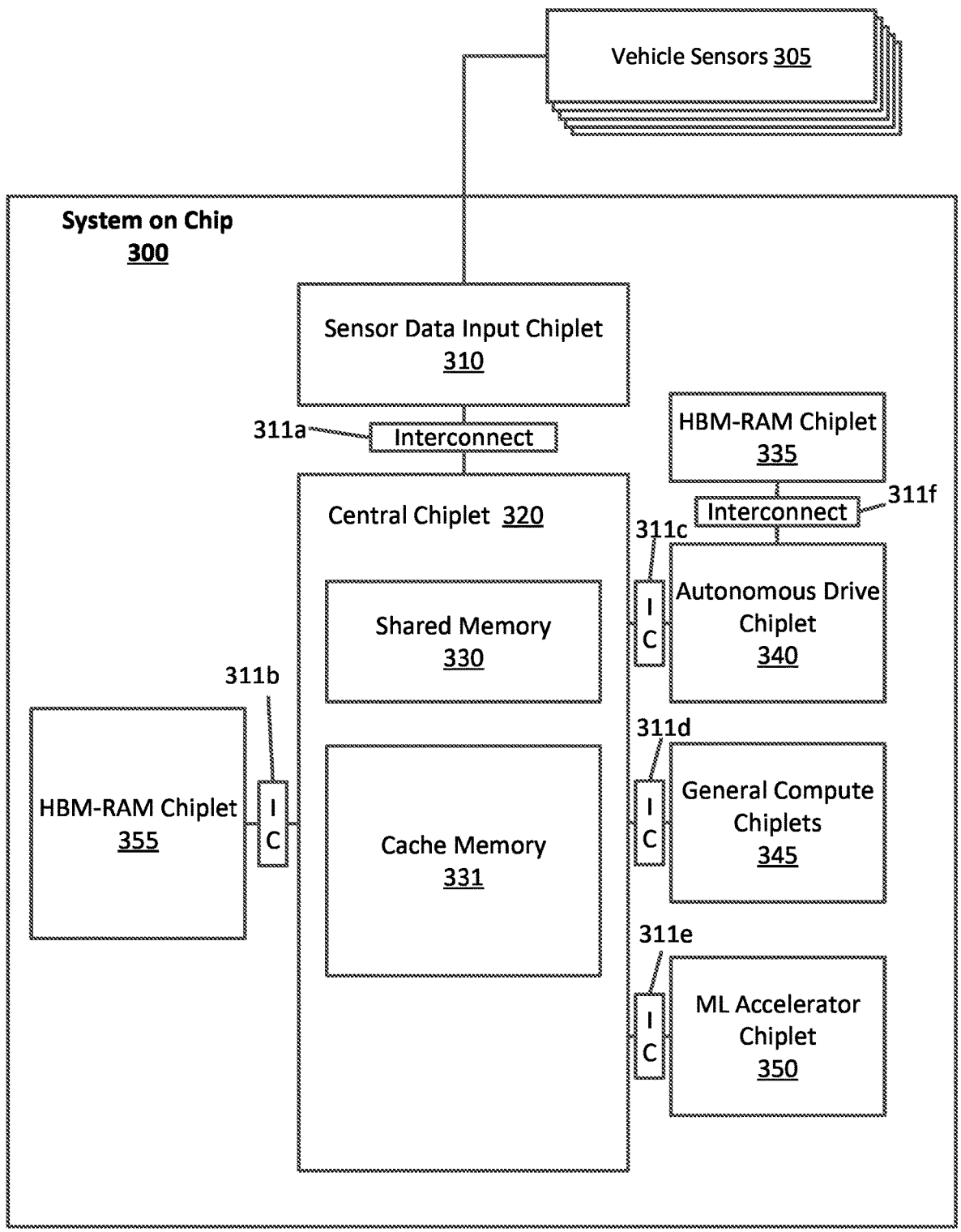
FIG. 3 is a block diagram illustrating an example SoC of an MSoC arrangement, in accordance with examples described herein.

FIG. 3 is a block diagram illustrating an example SoC 300, in accordance with examples described herein. The SoC 300 can comprise either the first SoC 210 or the second SoC 220 as shown and described in connection with FIG. 2. Furthermore, the example system on chip 300 shown in FIG. 3 can include additional components, and the components of system on chip 300 may be arranged in various alternative configurations other than the example shown. Thus, the system on chip 300 of FIG. 3 is described herein as an example arrangement for illustrative purposes and is not intended to limit the scope of the present disclosure in any manner.

Referring to FIG. 3, a sensor data input chiplet 310 of the system on chip 300 can receive sensor data from various vehicle sensors 305 of the vehicle. These vehicle sensors 305 can include any combination of image sensors (e.g., single cameras, binocular cameras, fisheye lens cameras, etc.), LIDAR sensors, radar sensors, ultrasonic sensors, proximity sensors, and the like. The sensor data input chiplet 310 can automatically dump the received sensor data as it's received into a cache memory 331 of the central chiplet 320. The sensor data input chiplet 310 can also include an image signal processor (ISP) responsible for capturing, processing, and enhancing images taken from the various vehicle sensors 305. The ISP takes the raw image data and performs a series of complex image processing operations, such as color, contrast, and brightness correction, noise reduction, and image enhancement, to create a higher-quality image that is ready for further processing or analysis by the other chiplets of the SoC 300. The ISP may also include features such as auto-focus, image stabilization, and advanced scene recognition to further enhance the quality of the captured images. The ISP can then store the higher-quality images in the cache memory 331.

In some aspects, the sensor data input chiplet 310 publishes identifying information for each item of sensor data (e.g., images, point cloud maps, etc.) to a shared memory 330 of a central chiplet 320, which acts as a central mailbox for synchronizing workloads for the various chiplets. The identifying information can include details such as an address in the cache memory 331 where the data is stored, the type of sensor data, which sensor captured the data, and a timestamp of when the data was captured.

To communicate with the central chiplet 320, the sensor data input chiplet 310 transmits data through an interconnect 311a. Interconnects 311a-f each represent die-to-die (D2D) interfaces between the chiplets of the SoC 300. In some aspects, the interconnects include a high-bandwidth data path used for general data purposes to the cache memory 331 and a high-reliability data path to transmit functional safety and scheduler information to the shared memory 330. Depending on bandwidth requirements, an interconnect may include more than one die-to-die interface. For example, interconnect 311a can include two interfaces to support higher bandwidth communications between the sensor data input chiplet 310 and the central chiplet 320.

In one aspect, the interconnects 311a-f implement the Universal Chiplet Interconnect Express (UCIe) standard and communicate through an indirect mode to allow each of the chiplet host processors to access remote memory as if it were local memory. This is achieved by using a specialized Network on Chip (NoC) Network Interface Unit (NIU) (allows freedom of interferences between devices connected to the network) that provides hardware-level support for remote direct memory access (RDMA) operations. In UCIe indirect mode, the host processor sends requests to the NIU, which then accesses the remote memory and returns the data to the host processor. This approach allows for efficient and low-latency access to remote memory, which can be particularly useful in distributed computing and data-intensive applications. Additionally, UCIe indirect mode provides a high degree of flexibility, as it can be used with a wide range of different network topologies and protocols.

In various examples, the system on chip 300 can include additional chiplets that can store, alter, or otherwise process the sensor data cached by the sensor data input chiplet 310. The system on chip 300 can include an autonomous drive chiplet 340 that can perform the perception, sensor fusion, trajectory prediction, and/or other autonomous driving algorithms of the autonomous vehicle. The autonomous drive chiplet 340 can be connected to a dedicated HBM-RAM chiplet 335 in which the autonomous drive chiplet 340 can publish all status information, variables, statistical information, and/or processed sensor data as processed by the autonomous drive chiplet 340.

In various examples, the system on chip 300 can further include a machine-learning (ML) accelerator chiplet 340 that is specialized for accelerating AI workloads, such as image inferences or other sensor inferences using machine learning, in order to achieve high performance and low power consumption for these workloads. The ML accelerator chiplet 340 can include an engine designed to efficiently process graph-based data structures, which are commonly used in AI workloads, and a highly parallel processor, allowing for efficient processing of large volumes of data. The ML accelerator chiplet 340 can also include specialized hardware accelerators for common AI operations such as matrix multiplication and convolution as well as a memory hierarchy designed to optimize memory access for AI workloads, which often have complex memory access patterns.

The general compute chiplets 345 can provide general purpose computing for the system on chip 300. For example, the general compute chiplets 345 can comprise high-powered central processing units and/or graphical processing units that can support the computing tasks of the central chiplet 320, autonomous drive chiplet 340, and/or the ML accelerator chiplet 350.

In various implementations, the shared memory 330 can store programs and instructions for performing autonomous driving tasks. The shared memory 330 of the central chiplet 320 can further include a reservation table that provides the various chiplets with the information needed (e.g., sensor data items and their locations in memory) for performing their individual tasks. Further description of the shared memory 330 in the context of the dual SoC arrangements described herein is provided below with respect to FIG. 4. The central chiplet 320 also includes the large cache memory 331, which supports invalidate and flush operations for stored data.

Cache miss and evictions from the cache memory 331 are sent by a high-bandwidth memory (HBM) RAM chiplet 355 connected to the central chiplet 320. The HBM-RAM chiplet 355 can include status information, variables, statistical information, and/or sensor data for all other chiplets. In certain examples, the information stored in the HBM-RAM chiplet 355 can be stored for a predetermined period of time (e.g., ten seconds) before deleting or otherwise flushing the data. For example, when a fault occurs on the autonomous vehicle, the information stored in the HBM-RAM chiplet 355 can include all information necessary to diagnose and resolve the fault. Cache memory 331 keeps fresh data available with low latency and less power required compared to accessing data from the HBM-RAM chiplet 355.

In various implementations, the shared memory 330 can house programs and instructions for performing autonomous driving tasks. The shared memory 330 of the central chiplet 320 can further include a reservation table that provides the various chiplets with the information needed (e.g., sensor data items and their locations in memory) for performing their individual tasks. Further description of the shared memory 330 in the context of the dual SoC arrangements described herein is provided below with respect to FIG. 4.

Figure 4:
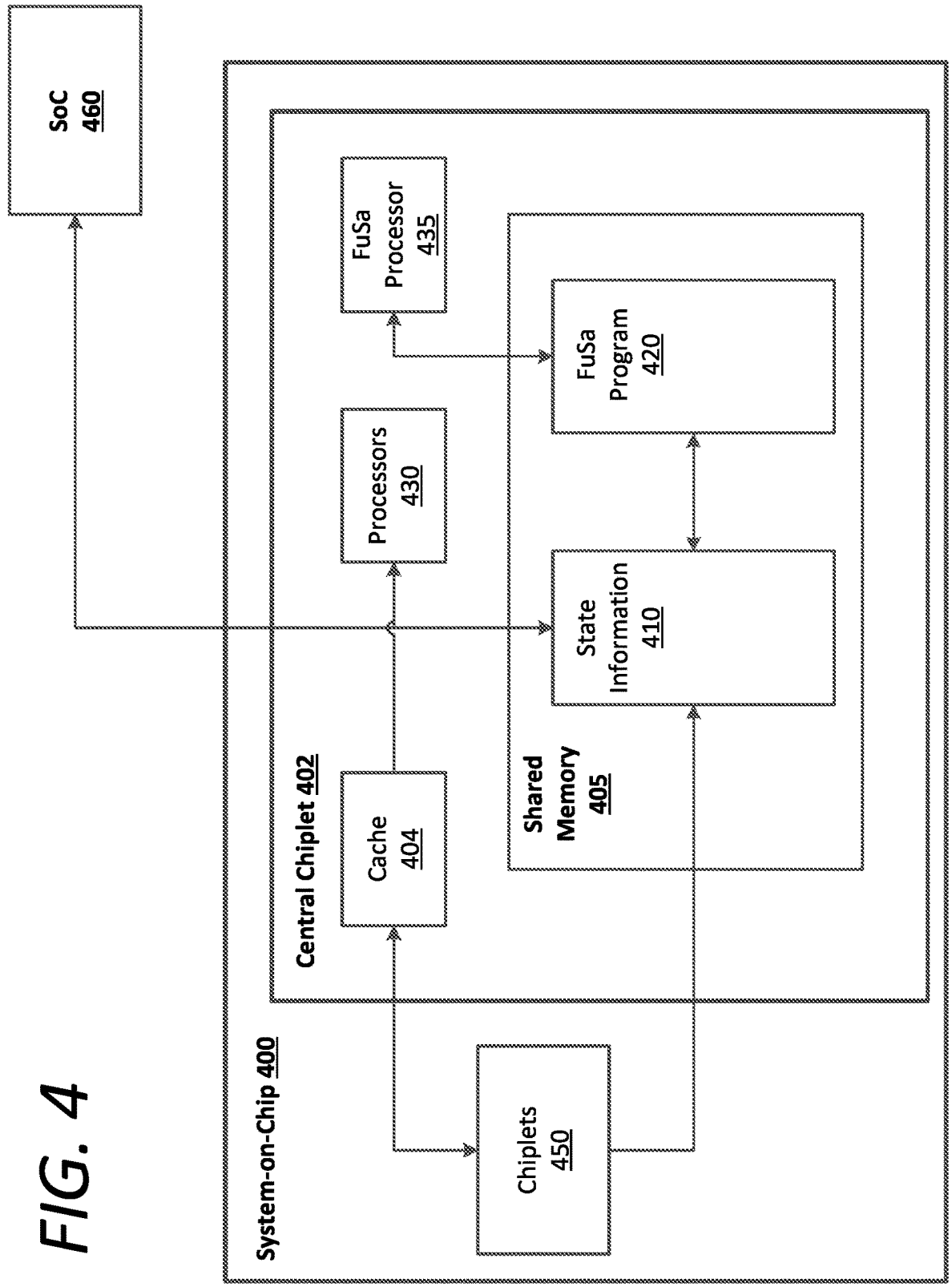
FIG. 4 is a block diagram depicting an example central chiplet of an SoC that includes a shared memory device for implementing duplicated status and shadowing for multiple SoCs, according to examples described herein.

FIG. 4 is a block diagram depicting an example central chiplet 402 of an SoC 400 that includes a shared memory 405 for implementing duplicated status and shadowing for multiple SoCs, according to examples described herein. The central chiplet 402 shown in FIG. 4 can correspond to the central chiplet 320 of the SoC 300 as shown and described with respect to FIG. 3. Furthermore, the additional chiplets 450 shown with respect to FIG. 4 can correspond to one or more of the sensor data input chiplet 310, autonomous drive chiplet 340, general compute chiplets 345, or ML accelerator chiplet 350 of FIG. 3.

Referring to FIG. 4, the central chiplet 402 of a primary SoC 400 can include a shared memory 405 that stores state information 410 published by a set of processors 430 of the central chiplet 402 as well as the other chiplets 450 of the SoC 400. In various examples, the set of processors 430 and the additional chiplets 450 perform the set of tasks (e.g., autonomous driving tasks) and publish state information 410 corresponding to those tasks in the shared memory 405 of the central chiplet 402. Additionally or alternatively, the set of processors 430 and the additional chiplets 450 can publish state information 410 corresponding to the set of tasks in a cache 404 of the central chiplet. As provided herein, the state information 410 can comprise any information needed for a backup SoC 460 to take over the set of tasks. This can include statistical information corresponding to the surrounding environment of the vehicle (e.g., the last images from cameras, last datasets from other sensors, classified objects, their locations, localization information of the vehicle, etc.), as well as performance data of the hardware components of the primary SoC 400 (e.g., bandwidth, temperature, memory information). The backup SoC 460 can have access to the shared memory 405 as well as the cache 404 of the central chiplet 402 to obtain the state information 410 and necessary datasets for seamlessly taking over the autonomous driving tasks from the primary SoC 400. In further examples, the backup SoC 460 can include a sensor data input chiplet that has direct data access to the sensor system of the vehicle. When the backup SoC 460 takes over the primary role from SoC 400, the sensor data input chiplet is initiated to obtain real-time sensor data from the vehicle sensors to continue the autonomous driving operations.

In various examples, the shared memory 405 can include a FuSa program 420 that performs health monitoring and error management operations for the primary SoC 400 as well as the backup SoC 460. Likewise, the backup SoC 460 can also include a set of chiplets and a central chiplet with a shared memory (or cache) in which the components of the backup SoC 460 publish state information. The central chiplet of the backup SoC 460 can further include FuSa components for performing health monitoring and error management tasks for the backup SoC 460, as well as having direct memory access to the state information 410 of the primary SoC 400. In certain examples, the FuSa components can include a dedicated FuSa processor 435 to execute the FuSa program 420 and perform the health monitoring and error management functions described throughout the present disclosure.

In various implementations, the FuSa program 420 of the primary SoC 400 can access the shared memory of the backup SoC 460 to dynamically read the state information of the backup SoC 460. In further implementations, the FuSa program of the backup SoC 460 can access and dynamically read the state information 410 in the shared memory 405 of the primary SoC 400. When a triggering event occurs (e.g., a fault or failure), as detected in the state information 410 by the FuSa program of the backup SoC 460, the backup SoC 460 can take over the set of tasks being performed by the primary SoC 400. Thereafter, SoC 400 may reboot or reset the component(s) experiencing the fault or failure, or can reboot or reset the SoC 400 itself, and assumes the role of backup SoC 400.

In doing so, SoC 400 can power down the chiplets 450 and/or the processors 430 of the central chiplet 402 and can maintain the powered-up state for the FuSa processor 435 to execute the FuSa program 420 and monitor the state information published by the SoC 460 in its own shared memory or cache. Accordingly, in autonomous driving applications, the autonomous driving tasks previously performed by the primary SoC 400, can be seamlessly transferred to the backup SoC 460 when the triggering event in the state information 410 is detected by the backup SoC 460.

In further embodiments, each time the SoCs 400, 460 are rebooted, they can switch between the role of primary SoC and backup SoC to provide substantially even wear of the hardware components of each SoC 400, 460. It is contemplated that the arrangements shown with respect to FIGS. 2, 3, and 4 can increase the wear life of the SoCs, provide redundancy to increase reliability in performing the set of tasks, and therefore provide an increased safety integrity rating (e.g., ASIL rating) for the SoC arrangement, as well as the autonomous driving system of the vehicle. It is further contemplated that for autonomous drive systems to operate on public roads, an ASIL-D rating may be necessary, and the arrangements and embodiments described throughout the present disclosure can advance the autonomous drive system in terms of safety and integrity to facilitate achieving this rating.

Methodology

Figure 5:
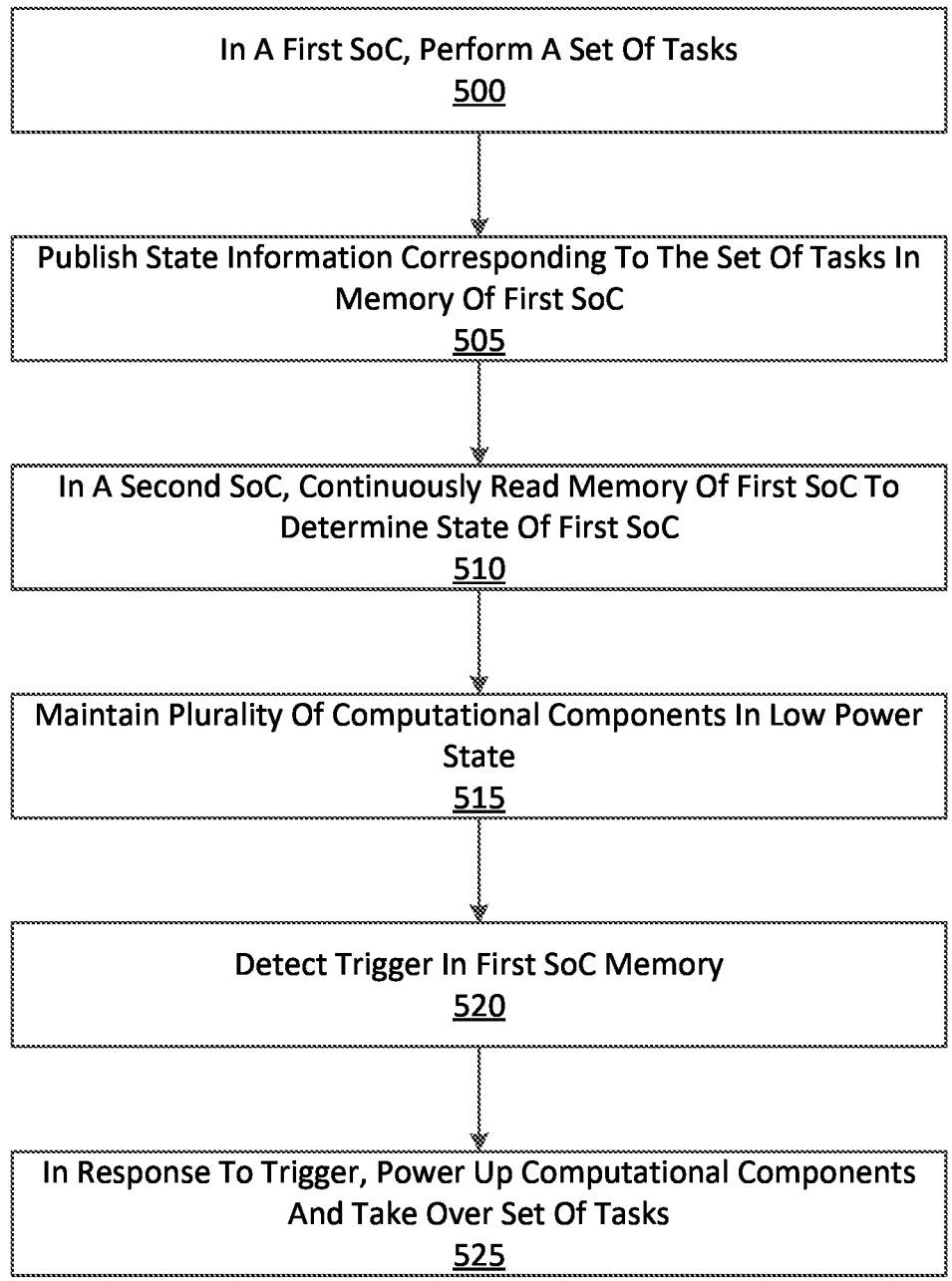
FIGS. 5 and 6 are flow charts describing methods of implementing duplicated status and shadowing for multiple SoCs, according to examples described herein.
Figure 6:
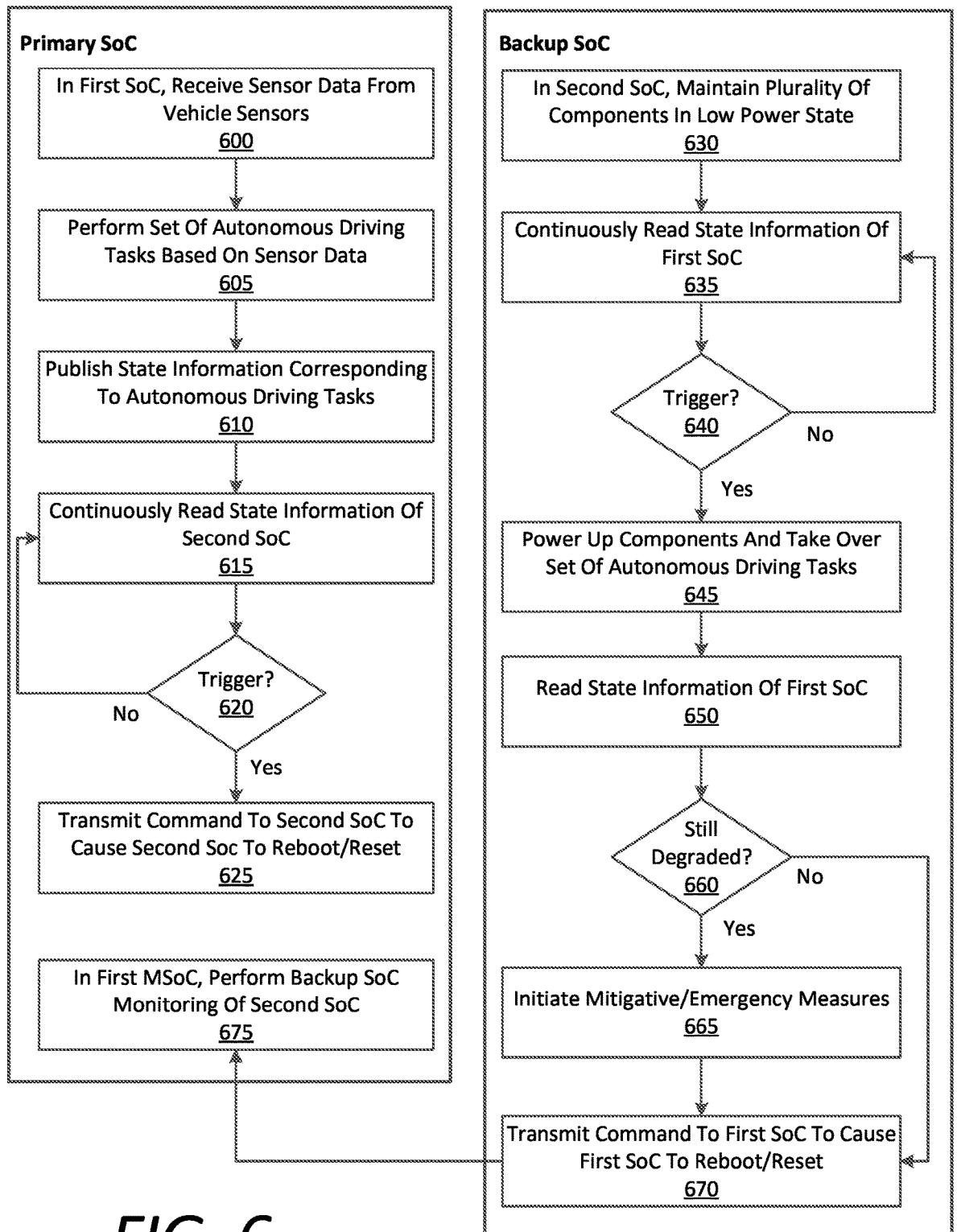

FIGS. 5 and 6 are flow charts describing methods of implementing duplicated status and shadowing for multiple SoCs, according to examples described herein. In the below discussion of the methods of FIGS. 5 and 6, reference may be made to reference characters representing certain features described with respect to the systems diagrams of FIGS. 1 through 4. Furthermore, the steps described with respect to the flow charts of FIGS. 5 and 6 may be performed by the computing systems 100, 200 and MSoC arrangements as shown and described with respect to FIGS. 1 through 4. Further still, certain steps described with respect to the flow charts of FIGS. 5 and 6 may be performed prior to, in conjunction with, or subsequent to any other step, and need not be performed in the respective sequences shown.

Referring to FIG. 5, at block 500, in a first SoC 210 of a MSoC arrangement, perform a set of computational tasks. At block 505, the first SoC 210 publishes state information corresponding to the set of tasks in memory 215 of the first SoC 210. In some implementations, the set of tasks can comprise any computer tasks performed by a primary SoC 210 in a dual SoC arrangement, such as application-based tasks, enterprise software tasks, computer security tasks, and the like. In accordance with examples described herein, the set of tasks can comprise a set of autonomous driving tasks for an autonomous or semi-autonomous vehicle. These tasks can comprise sensor data processing tasks, such as perception, inference, object detection and/or classification, right-of-way determination, occupancy grid determination, motion prediction, motion planning, and/or vehicle control tasks for the autonomous vehicle.

At block 510, in a second SoC 220 of the dual SoC arrangement, continuously read the memory 215 of the first SoC 210 to determine the state of the first SoC 210. At block 515, the second SoC 220 can further maintain a plurality of computational components in a low powered state. As provided herein, the plurality of computational components can comprise the various chiplets required to perform the set of tasks currently being performed by the first SoC 210. In the context of FIG. 3, these chiplets can correspond to one or more of the HBM-RAM chiplet 335, autonomous drive chiplet 340, general compute chiplets 345, ML accelerator chiplet 350, and HBM-RAM chiplet 355. In further implementations, certain components of the central chiplet 320 (e.g., one or more CPUs) can also be maintained in the low power state. As provided herein, the low power state can comprise a standby state in which the chiplets are warmed up and ready to take over the set of tasks at any given moment.

At block 520, the second SoC 220 can detect a trigger in the memory 215 of the first SoC 210. The trigger can correspond to any fault, failure, or other error published by the first SoC 210 in memory 215, or otherwise detected by the second SoC 220 via monitoring the memory 215 of the first SoC 210. Such faults, failures, or errors can correspond to hardware faults or failures in the first SoC 210, temperature thresholds being exceeded, software glitches or other software faults, and the like. Upon detecting the trigger, at block 525, the second SoC 220 can power up the plurality of computational components and take over the set of tasks from the first SoC 210.

FIG. 6 is a flow chart describing a further method of implementing duplicated status and shadowing for a dual SoC arrangement, in accordance with examples described herein. In the below discussion of FIG. 6, reference may be made to the SoC 300, SoC 400, and SoC 460 as the primary or backup SoC in the dual SoC arrangement. Referring to FIG. 6, at block 600, a first SoC 400 can receive sensor data from a set of vehicle sensors 305. At block 605, the first SoC 400 can perform a set of autonomous driving tasks based on the sensor data. For example, the first SoC 400 can include a set of chiplets, as shown in FIG. 3, that each perform one or more autonomous driving tasks that include one or more perception, inference, object detection and/or classification, right-of-way determination, occupancy grid determination, motion prediction, motion planning, and/or vehicle control tasks for the autonomous vehicle. In certain examples, the autonomous driving tasks can comprise sensor data perception and inference tasks for autonomously operating a vehicle along a travel route. At block 610, the first SoC 400 can further publish state information 410 in a shared memory 405 of the first SoC 400.

It is contemplated that any multiple-SoC arrangement can be used to implement the duplicated status and shadowing techniques described herein. For example, a three-SoC arrangement can be used in a primary, secondary, and tertiary configuration (or a primary SoC and two secondary SoC configuration), with each SoC having direct memory access to the other SoCs to monitor state information. In such a configuration, when the primary SoC experiences a fault, failure, or error, the secondary SoC can take over the autonomy tasks as the primary SoC and the tertiary SoC can become the secondary SoC. This sequential status change for SoCs in multiple-SoC arrangements can be applied to any number of SoCs (e.g., four or more). In variations, the secondary and tertiary SoCs (or both secondary SoCs) can implement a voting system to take over the autonomy tasks from the primary SoC (e.g., based on hardware wear). For such voting system implementations, any number of SoCs in any multiple-SoC arrangement can be configured.

At block 615, the first SoC 400 can further continuously read state information of the second SoC 460. For example, the state information of the second SoC 460 can indicate the operating parameters of the various computational components (e.g., chiplets) of the second SoC 460 in the low powered state, and can further indicate whether these components are operating within those parameters (e.g., whether the components are warmed up and ready to take over the set of autonomous driving tasks). At decision block 620, the first SoC 300 can dynamically determine whether a trigger has been detected in the state information of the second SoC 460. As provided herein, the trigger can correspond to any of the components of the second SoC 460 operating outside nominal parameters, or a fault, failure, or error experienced by the second SoC 460. If no trigger is detected, then the first SoC 400 can continue monitoring the state information of the second SoC 460. However, if at any time a trigger is detected, then at block 625, the first SoC 400 can, for example, transmit a command to the second SoC 460 to cause the second SoC 460 to perform a system reboot. As described herein, information communicated between SoC 400 and SoC 460 can be transmitted via a robust, ASIL-D rated interconnect (e.g., interconnect 240 shown in FIG. 2) using an error correction code (ECC), which provides redundancy algorithmically (e.g., through use of block codes, convolutional codes, and the like).

At block 630, the second SoC 460 can maintain a plurality of computational components in a low power state. As described above, these components can include any one or more of the chiplets as shown and described with respect to FIG. 3. At block 635, the second SoC 460 can continuously read the state information 410 as published by the first SoC 400. At decision block 640, the second SoC 460 can determine whether a trigger is detected in the state information 410. As provided herein, the trigger can correspond to the first SoC 400 experiencing a fault or a failure, where the fault or the failure can correspond to the first SoC 400 experiencing degraded performance, such as overheating, a power surge, or an error in the first SoC 400. If no trigger is detected, then the second SoC 460 can continue to monitor the state information 410 of the first SoC 400. However, if a trigger is detected at any time, at block 645, the second SoC 460 can power up its computational components and take over the set of autonomous driving tasks from the first SoC 400, while the first SoC 400 powers down its components and assumes the role of backup SoC.

At block 650, the second SoC 460 can continue to read the state information 410 of the first SoC 400. At decision block 660, the second SoC 460 can determine whether the first SoC 400 is still degraded. If so, at block 665, the second SoC 460 can initiate a set of mitigative or emergency measures. In certain aspects, these measures can comprise reducing the speed of the vehicle, providing a notification to any passengers in the vehicle (e.g., to take over manual control of the vehicle), autonomously operating the vehicle to a safe location (e.g., pulling over the vehicle or driving to a home location), and/or autonomously operating the vehicle to a service center to resolve the degraded status of the first SoC 400.

In some examples, at block 670, the second SoC 460 may further transmit a command to cause the first SoC 400 to perform a system reboot. At block 655, the first SoC 400 may then perform the backup SoC tasks, such as maintaining a subset of its components in a low power state and dynamically monitoring state information as published by the primary SoC 460. If at any time, the primary and secondary SoCs are unable to communicate (e.g., one of the SoCs is unable to boot up), the autonomous drive system of the vehicle will not engage. It is contemplated that this arrangement provides necessary redundancy for an increased ASIL rating of the autonomous drive system of the vehicle (e.g., contributes to an ASIL-D rating).

In various examples, each time the MSoC arrangement reboots, the first SoC 400 and the second SoC 460 can switch between primary and backup roles to maintain substantially even wear on the MSoC components, such as the various chiplets of each SoC. Furthermore, the SoCs can be electrically coupled via one or more eFuses that protect the SoCs from each other (e.g., from voltage or current surges). Along these lines, the first SoC 400 and the second SoC 460 can be powered by distinct power sources, such as the battery pack used for propulsion of the vehicle, and the auxiliary power source of the vehicle used for powering the auxiliary components (e.g., ECU, lights, radio, etc.).

As provided herein, the state information monitoring and error management functions performed by the first and second SoCs 400, 460 can be performed by functional safety components of each SoC, as shown in FIG. 4 (e.g., the FuSa program 420 and FuSa processor 435). As further provided herein, for the backup SoC, the FuSa components remain powered up to perform their functional safety tasks while the remaining components are maintained in the low power state, and ready to assume the primary SoC tasks. It is contemplated that the first SoC 400 and the second SoC 460 being arranged to dynamically read state information and take over the set of tasks of the primary SoC provides redundancy to facilitate an automotive safety integrity level rating for the autonomous drive computing system (e.g., achieve an ASIL-D rating).

It is contemplated for examples described herein to extend to individual elements and concepts described herein, independently of other concepts, ideas or systems, as well as for examples to include combinations of elements recited anywhere in this application. Although examples are described in detail herein with reference to the accompanying drawings, it is to be understood that the concepts are not limited to those precise examples. As such, many modifications and variations will be apparent to practitioners skilled in this art. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mention of the particular feature.

What is claimed is:

1. A computing system comprising:
   a first system on a chip (SoC) comprising a first memory in which the first SoC publishes state information corresponding to a set of tasks being performed by the first SoC, the first SoC comprising a first plurality of computational components; and
   a second SoC comprising a second memory and a second plurality of computational components, the second SoC having memory access to the first memory of the first SoC to dynamically read the state information published by the first SoC, wherein the second SoC maintains a subset of the second plurality of computational components in a low power state;
   wherein when the second SoC detects a trigger while reading the state information published in the first memory of the first SoC, the second SoC powers the subset of the second plurality of computational components to take over the set of tasks;
   wherein each time the computing system is rebooted, the first SoC and the second SoC switch roles in (i) performing the set of tasks versus (ii) placing a subset of their respective plurality of computational components in the low power state and dynamically reading published state information from the first SoC or second SoC.

2. The computing system of claim 1, wherein the set of tasks comprises autonomous driving tasks.

3. The computing system of claim 2, wherein the autonomous driving tasks comprise sensor data perception and inference tasks for autonomously operating a vehicle along a travel route.

4. The computing system of claim 1, wherein the trigger corresponds to the first SoC experiencing a fault or a failure, the fault or the failure corresponding to the first SoC overheating, a power surge, or an error in the first SoC.

5. The computing system of claim 1, wherein the first SoC is powered by a first power source of a vehicle, and wherein the second SoC is powered by a second power source of the vehicle.

6. The computing system of claim 5, wherein the first power source comprises a battery pack used for propulsion of the vehicle, and wherein the second power source comprises an auxiliary power source of the vehicle.

7. The computing system of claim 1, wherein the first SoC and the second SoC are electrically coupled to each other via an interconnect having at least one electrical safety switch to protect the computing system from power surges from either the first SoC or the second SoC.

8. The computing system of claim 1, wherein the first SoC dynamically reads the second memory of the second SoC to determine whether the second SoC is ready to take over the set of tasks being performed by the first SoC.

9. The computing system of claim 1, wherein the first SoC and the second SoC being arranged to dynamically read the state information and take over the set of tasks provides redundancy to facilitate an automotive safety integrity level (ASIL) rating for the computing system.

10. The computing system of claim 1, wherein the first plurality of computational components and the second plurality of computational components comprise chiplets of each of the first SoC and the second SoC.

11. The computing system of claim 10, wherein the subset of the second plurality of computational components of the second SoC that are in the low power state comprise a plurality of the following: one or more general compute chiplets, one or more autonomous drive chiplets, one or more machine learning accelerator chiplets, one or more sensor input chiplets, or one or more high bandwidth memory chiplets.

12. The computing system of claim 11, wherein the first plurality of computational components of the first SoC and the second plurality of computational components of the second SoC each include a functional safety (FuSa) CPU that publishes state information of the first SoC and the second SoC to a FuSa component of the first memory and the second memory respectively.

13. The computing system of claim 12, wherein the first SoC and the second SoC do not place the FuSa CPU in the low power state.

14. The computing system of claim 1, wherein when the second SoC takes over the set of tasks from the first SoC, the first SoC resets or reboots the first plurality of computational components.

15. A computing system comprising:
    a first system on a chip (SoC) comprising a first memory in which the first SoC publishes state information corresponding to a set of tasks being performed by the first SoC, the first SoC comprising a first plurality of computational components, wherein the state information comprises statistical information corresponding to a surrounding environment of a vehicle in which the computing system resides; and
    a second SoC comprising a second memory and a second plurality of computational components, the second SoC having memory access to the first memory of the first SoC to dynamically read the state information published by the first SoC, wherein the second SoC maintains a subset of the second plurality of computational components in a low power state,
    wherein when the second SoC detects a trigger while reading the state information published in the first memory of the first SoC, the second SoC powers the subset of the second plurality of computational components to take over the set of tasks.

16. A computer-implemented method comprising:
    at a first system on a chip (SoC) comprising a first memory, publishing state information corresponding to a set of tasks being performed by the first SoC in the first memory, the first SoC comprising a first plurality of computational components, wherein the state information comprises statistical information corresponding to a surrounding environment of a vehicle in which the computing system resides; and at a second SoC comprising a second memory and a second plurality of computational components, (1) accessing the first memory of the first SoC to dynamically read the state information published by the first SoC, wherein the second SoC maintains a subset of the second plurality of computational components in a low power state, (ii) detecting a trigger while reading the state information published in the first memory of the first SoC, and (iii) in response to detecting the trigger, powering the subset of the second plurality of computational components to take over the set of tasks from the first SoC.

17. The computer-implemented method of claim 16, wherein the set of tasks comprises autonomous driving tasks.

18. The computer-implemented method of claim 17, wherein the autonomous driving tasks comprise sensor data perception and inference tasks for autonomously operating a vehicle along a travel route.

* * * * *